Oct. 19, 1965 P. L. READ 3,213,386

SERIES AMPLIFIERS

Filed Dec. 4, 1961

Inventor:
Philip L. Read,
by John P. Dellitt
His Attorney.

United States Patent Office 3,213,386

Patented Oct. 19, 1965

3,213,386
SERIES AMPLIFIERS

Philip L. Read, Schenectady, N.Y., assignor to General Electric Company, a corporation of New York Filed Dec. 4, 1961, Ser. No. 157,873
9 Claims. (Cl. 330—70)

Figures 1, 2:
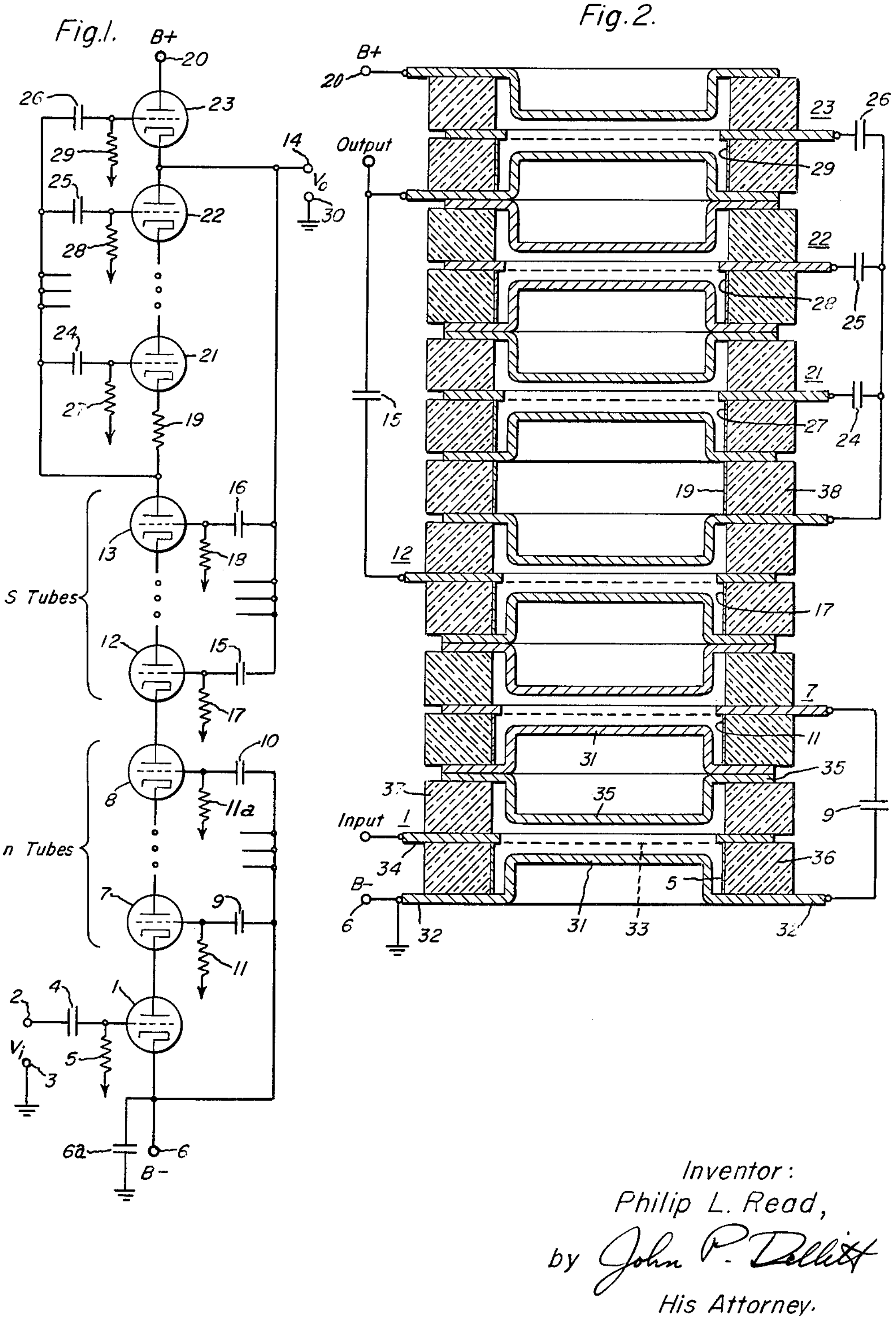

The present invention relates to high gain, low output impedance amplifiers and more particularly to such amplifiers employing series circuits configurations.

It is sometimes desirable to connect active amplifying devices, e.g. vacuum tubes, in a series circuit configuration instead of in the usual cascaded arrangement. In a series configuration the space current paths of the devices are effectively coupled in series. One such amplifier employs a grounded-cathode triode stage followed by a grounded-grid triode stage wherein the space current paths of the two tubes are in series at least at the operating frequency of the device. This configuration achieves relatively high gain with a relatively low noise figure.

It has been proposed to further expand the series arrangement, for example by adding further grounded-grid stages above the input stage to obtain even higher gain with low noise. However, adding stages in this manner ordinarily results in an impractically high output impedance and requires a very high passive load resistance leading to an impractically high voltage anode power supply if high gains are desired. It is difficult to drive a useful load because of the difficulty or impossibility of securing a desirable match between the high output impedance and the load. Moreover, optimum gain is not even readily attainable from the aforementioned prior art circuit, which employs a single such grounded-grid stage, because of the load impedance problem. In that and other prior art series circuits, the number of active amplifying elements which may be effectively coupled in series is thus quite limited.

The introduction of miniaturized low voltage electric discharge devices, which can be physically stacked in miniature circuit modules, makes a more extensive series circuit arrangement even more desirable. For example, thin wafer-like vacuum triodes have been introduced which have a diameter on the order of 0.32 inch and a height of approximately .073 inch. These discharge devices are conveniently stacked into an integral circuit arrangement as set forth in the copending application of Walter C. Grattidge, Serial Number 607,732, filed September 4, 1956, now abandoned, and assigned to the present assignee. The integrated devices known as "Thermionic Integrated Micromodules" are also described in Electronics, May 15, 1959, page 80. Such modules are not subject to heat limitations because of their close packing but actually employ environmental heat to establish thermionic emission; therefore large numbers may be accommodated in a limited space. It would be desirable to arrange an appreciable number of such discharge devices in a series amplifier configuration in a small space utilizing a single power supply connection while eliminating a large number of passive components and interconnections.

It is therefore an object of the present invention to provide an improved high gain-low noise amplifier.

It is another object of the present invention to provide an improved amplifier apparatus of the high gain-low noise type disposed in a general series arrangement.

It is still another object of the present invention to provide an improved high gain-low noise amplifier exhibiting low output impedance for driving various useful loads.

It is another object of the present invention to provide an improved series amplifier arrangement exhibiting high linearity.

It is yet another object of the present invention to provide an improved amplifier arrangement wherein the units are serially stacked, using a small number of passive elements and interconnections.

It is another object of the present invention to provide an improved amplifier apparatus which draws a low power supply current and which is relatively insensitive to variations in power supply voltage.

In accordance with an embodiment of the present invention a high gain amplifier such as a grounded-cathode, grounded-grid type is followed in essentially a series arrangement with one or more output amplifying devices which reflect a very high effective load impedance to the grounded-grid stage or stages. A highly amplified output signal is derived from one of the output amplifying devices preferably remote from the grounded-grid stage or stages.

According ot a feature of the present invention one or more further amplifying devices are disposed in a series arrangement, and have their input electrodes connected to supply a considerable amount of negative voltage feedback around at least a portion of the output amplifying or load impedance devices. A load resistor is desirably included between the negative feedback stages and the output stages.

It is possible to achieve very high amplifications and very low output impedances with the arrangement according to the present invention. The arrangement enables the inclusion of a considerably greater number of amplifying devices in a series arrangement than heretofore possible.

The subject matter which I regard as my invention is particularly pointed out and distinctly claimed in the concluding portion of this specification. The invention, however, both as to organization and method of operation, together with further objects and advantages thereof, may best be understood by reference to the following description taken in connection with the accompanying drawings wherein like reference characters refer to like elements and in which:

FIG. 1 is a schmatic diagram of a circuit in accordance with the present invention, and FIG. 2 is a vertical cross-section through a micromodular embodiment in accordance with the present invention.

Referring to FIG. 1, a first amplifier tube, 1, receives an input signal $V_i$ presented to input terminals 2 and 3 through coupling capacitor 4 connected between the grid of tube 1 and terminal 2. Terminal 3 is grounded. Grid resistor 5 is returned to a source of bias voltage, or to the cathode of tube 1 as may be convenient. Tube 1 may be described as a grounded-cathode stage since its cathode is returned to B— power supply terminal 6 which is at ground potential at least for the frequency of operation.

Tube 1 drives tubes 7 and 8, which may be described as grounded-grid stages since their grids are connected to B— terminal 6, through grid capacitors 9 and 10, respectively. Grid resistors 11 and **11*a* are returned to bias potential sources or alternatively the respective cathodes. The anode of tube 1 is connected to the cathode of tube 7 while the anode of tube 7 is coupled to the cathode of tube 8. In this manner the output at the anode of tube 1 alters the grid-cathode input of tube 7 and also tube 8** by changing their cathode voltage relative the grounded grid. The number of grounded grid stages is designated as "*n*" on the drawing, it being understood two are illustrated only as a matter of diagramatic convenience. Further stages may be provided between tubes 7 and 8 as indicated by the dotted line in the connection therebetween. Further successive tubes have their space current paths, i.e. their cathode and anode connections included in the serial arrangement of tubes as shown, while the respective grids are returned to the operation frequency ground.

The anode of tube 8 is connected to the cathode of tube 12 and the latter is designated as a degenerative or negative feedback stage. The anode of tube 12 is further coupled to another degenerative feedback stage, tube 13, while the grids of these tubes are coupled to a point in the circuit above tube 13, as hereinafter more fully set forth, e.g. to apparatus output terminal 14 through coupling capacitors 15 and 16, respectively, this coupling providing input for stages 12 and 13 in proper phase to accomplish degenerative feedback in the series system. Tubes 12 and 13 are designated "*s*" tubes, it being understood that other similarly connected tubes may be serially included therebetween as indicated by the dotted connection, wherein the total number of such tubes equals *s*. As before, the grids are returned to bias sources or the respective tube cathodes by resistors 17 and 18.

The anode of tube 13 is connected to a load impedance 19 the latter conveniently comprising a resistance, but this load impedance is not connected directly to power supply B+ terminal 20; the load impedance is actually coupled to B+ through a series path comprising the cathode-anode circuits of output tubes 21, 22 and 23. Again, it is understood the illustrated number of output tubes shown is a matter of diagrammatic convenience, other criteria being used to determine the number of output stages as hereinafter more fully set forth. The grids of these tubes are coupled to the tube 13 end of load impedance 19 through input capacitors 24, 25 and 26, respectively. The grids are returned to bias sources or the respective cathodes through resistors 27, 28 and 29.

The grids of tubes 12 and 13 are coupled to a point in the circuit above the load impedance 19 and preferably above output tube 21. Thus a negative feedback path is established around at least a portion of the output tubes.

A system output terminal 14 is coupled to the connection between the anode of tube 22 and the cathode of tube 23 but may be similarly connected to the cathode of any of these output stages or to the anode of tube 13. The signal amplification found at any of the aforementioned output connections is quite similar but the output impedance is lowest for the connection as shown, i.e., at the cathode of tube 23 being the last tube before power supply terminal 20.

The output signal $V_0$ is provided with respect to ground between the terminals 14 and 30, wherein terminal 30 is connected to the system ground in common with input terminal 3. In many arrangements, including one to be hereinafter described, B− terminal 6 may also constitute the system common ground. However, when ordinary vacuum tubes are employed having a common filament supply possibly having a grounded connection, it is desirable for negative power supply terminal 6 to be grounded only for the operating frequencies, e.g. by means of capacitor 6*a*.

Although triode vacuum tubes are shown for purposes of illustration, it is understood that other types of electric discharge devices may be similarly employed, for example, pentodes. Triodes are preferred since they have the advantage of generating less internal noise. Also other types of active amplifying devices, for example, transistors and the like may be similarly utilized. In such instance the space current path or principal current-carrying path of the tube may be substituted with the emitter-collector transistor path, for example, the base terminal constituting the input analogous to the grid terminal. It is understood by those skilled in the art that such an arrangement will require appropriate alterations in the polarity of power supplies and ancillary connections.

When vacuum tubes are employed in the apparatus according to the present invention it is frequently convenient for all such vacuum tubes or electric discharge devices to be of the same type, having the same amplification factor, $\mu$, plate resistance, etc. In such event it is frequently convenient for load impedance 19 to comprise a resistor which has the same resistance as the plate resistance of each such electric discharge device. However this resistance can be altered considerably without changing the function of the circuit. For example, the resistor 19 can be dispensed with entirely, leaving a direct connection between tubes 13 and 21.

In the circuit illustrated in FIG. 1 it is seen that the circuit comprises a general series connection of the principal current-carrying paths of the amplifying devices between the power supply terminals. These amplifying devices are divided into four groups: (I) an input tube, tube 1, (II) grounded grid stages 7 and 8, (III) degenerative feedback stages 12 and 13, and (IV) output stages 21–23. These groups have definite functions with respect to one another. At least the first or bottom tube of each group (above the input tube) is arranged to have its control or grid electrode coupled to another group, as designated. That is, tube 7 has its grid grounded to B− terminal 6, while the grid of tube 12 is coupled to the output terminal 14, and the grid of tube 21 is coupled to the anode of tube 13. However, it is frequently convenient to connect the grids of one or more of the remaining stages to the cathode of the tube immediately therebelow in the serial arrangement. Thus the grid of the tube 23 may alternatively be coupled to the cathode of tube 22, etc. This arrangement results in essentially the same operation involving essentially the same high gain and low output impedance characteristics of the present invention.

Assuming the amplifying devices employed have substantially uniform characteristics throughout the series circuit, it is found desirable to provide a number of output amplifying devices equal to the number of other amplifying devices in the series arrangement. Thus, providing impedance 19 is equal to the plate resistance of one of the devices, the total number of the output devices, generally designated 21–23 in FIG. 1, should equal the number of "*s*" tubes plus the number of "*n*" tubes plus one. Such an arrangement has been found to produce substantially maximum gain. Reducing the number of output amylifying devices by one from the number given may reduce the net gain by nearly one-half. It is understood, however, the same result may be achieved without using identical amplifying devices by providing amplifying devices in various parts of the circuit whose characteristics are equivalent to more than one of such uniform devices and which therefore perform an equivalent function in the series arrangement.

Definite advantages are gained in arranging the amplifying devices of the present invention in an overall serial arrangement conductive at the apparatus operating frequency and conductive for the D.C. plate current as well. Thus, when microminiature electric discharge devices are used, a large number of such devices can be stacked closely together with few interconnections and with only two outside connections to carry the space current to and from the series amplifier. Electric discharge devices as set forth in the aforementioned application and article are available which have plate voltage requirements between 5 and 70 volts, depending upon individual construction and materials. It thus appears that a considerable number of such devices can be stacked in a series amplifier utilizing a common anode current without requiring a particularly high voltage B+ supply.

However, the present invention in its broader aspects is not limited to an arrangement where common D.C. current flows through all amplifying devices. Thus, for example, it is possible for a grounded cathode stage, e.g., tube 1 in FIG. 1, to drive a grounded grid stage, e.g., tube 7 in FIG. 1, without requiring a common D.C. space current between the two. Likewise, certain other groups of amplifying devices in the circuit or individual amplifying devices may be provided with individual sources of plate current if so desired, while retaining the high gain, low output impedance and low noise features of the present invention and the many other advantages thereof.

In operation, the apparatus of FIG. 1 acts to produce a highly amplified output signal at a desirably low impedance level, capable of driving various useful loads. An input signal $V_i$ between terminal 2 and terminal 3 is applied to tube 1. Tube 1 drives a plurality of grounded grid stages, the "*n*" tubes, through the common serial connection. Thus, if the voltage rises at terminal 2 with respect to terminal 3, the anode current for tube 1 will increase. The voltage at its anode will drop, lowering the voltage on the cathode of tube 7 with respect to its grid since the tube 7 grid is maintained at a relatively constant potential. The increased grid-cathode potential in tube 7 further increases the anode current through the serial connection. The anode of tube 7 likewise lowers in potential and this potential change is applied to further "*n*" tubes.

The combination of a grounded-cathode stage followed by a grounded-grid stage is found to provide fairly high amplification at a low noise level. However, as such "*n*" tubes or grounded-grid stages are added in addition to tube 7, the output impedance is found to be very large so that addition of such stages to increase amplification has not been heretofore feasible. Moreover, even with one grounded-grid stage, maximum amplification has not been readily attainable because the large output impedance presented is inconvenient in driving most loads.

In accordance with the present arrangement a number of output stages, e.g., 21–23 are included in the serial arrangement on the opposite side of load impedance or resistor 19 from the grounded-grid "*n*" tubes. These output stages have their grids generally connected at the low end of output resistor 19 or some other lower voltage point. Then as the current increases through output resistor 19, tubes 21–23 tend to draw less current. This is because the grid voltage of each tube is relatively negative-going. Insofar as the grounded-grid "*n*" stages are concerned, an anode impedance is set up which appears much larger than the value of load resistor 19. The result is much greater overall amplification than would result with load resistor 19 connected directly to the B+ terminal 20. The arrangement may be viewed as one wherein an extremely large output impedance is presented to grounded-grid "*n*" stages so the latter may realize maximum amplification. Such amplification is on the order of $\mu^n$ in value, where "*n*" is the number of the "*n*" grounded-grid tubes.

Intermediate the "*n*" tubes and the output tubes, a number of degenerative feedback stages which are designated "*s*" tubes are included in the serial combination. These "*s*" tubes have their respective grids coupled to a point in the circuit above the load resistor 19, preferably to the cathode of tube 23. They are disposed below output impedance 19 in the serial arrangement and act to produce degenerative effects on the series plate current by providing a feedback path around at least a portion of the output stages to render the output impedance quite low as seen between terminals 14 and 30. For an increase in output voltage (associated with an increased signal voltage $V_i$ and an increased serial anode current) a negative-going voltage is thus applied to the grids of "*s*" tubes 12 and 13, since the polarity of the apparatus output signal is opposite that of the input signal. This voltage feedback has the effect of lowering the output impedance seen between terminals 14 and 30, but does not decrease the amplification of the apparatus. Rather, the cathode and grid voltages on the "*s*" tubes tend to rise and fall together whereby no great change in amplification is produced. However, a considerable reduction in output impedance is achieved thereby.

It is seen that a coordinated double feedback path has been provided around the load resistance. The grids of tubes 12 and 13 connect at a point above the load resistance, while the grids of tubes 21–23 connect below the load resistance. Each coupling thus runs to the opposite side of the resistance.

For the connection wherein output terminal 14 is coupled to the cathode of tube 23, this connection being the most desirable, and wherein the number of output tubes$=n+s+1$, the voltage gain for the circuit as determined theoretically and verified experimentally is approximately equal to:

$$\frac{V_o}{V_i}\approx -\mu^{n+1}\left[1-\frac{R+r_p}{R\mu^{s+1}+r_p(\mu^s+1)}\right] \qquad (1)$$

where

R is the resistance of a resistive load impedance 19,
*n* is the number of *n* tubes, and $n=0$
*s* is the number of *s* tubes,
$\mu$ is the amplification factor for each of identical tubes in the circuit, and $\mu>>1$ and
$r_p$ is the plate resistance of each tube.

Likewise, the output impedance is approximately equal to:

$$Z_o\approx\frac{r_p(R+r_p)}{R\mu^{s+1}+r_p(\mu^s+1)} \qquad (2)$$

If R is made equal to *r* then the following results are obtained:

$$\frac{V_o}{V_i}\approx -\mu^{n+1}\left[1-\frac{2}{\mu^{s+1}}\right]\approx\mu^{n+1} \qquad (3)$$

$$Z_o\approx\frac{2r_p}{\mu^{s+1}} \qquad (4)$$

Assuming the number of output tubes is kept equal to the number of other tubes in the circuit, it is seen that the gain is primarily a function of "*n*" while the output impedance is primarily a function of "*s*." It therefore follows that gain and output impedance may be adjusted by altering the number of "*n*" and "*s*" tubes. As a matter of fact, either one can be made zero, if desired. However, it is apparent that a more practical circuit results if such is not the case. In theory, it is possible to obtain arbitrarily high gains and arbitrarily low output impedances with this arrangement. In practice, gains as great as $10^6$ and output impedances less than 1 ohm are easily achieved.

The illustrative circuit as set forth in FIG. 1 is primarily useful at low audio frequencies for measurement purposes and the like, it being understood that a somewhat more extensive circuit is usually desirable at higher frequencies. For example, at higher frequencies care should be taken to prevent various unwanted forms of feedback from lowering the amplification and raising the output impedance somewhat. Thus stray capacitance is neutralized and advantageous shielding achieved by enclosing at least the high impedance portions of the circuit in a shield which is "driven" from the low impedance output.

In addition the apparatus according to the present invention is readily adapted to frequency-selective operation by inserting passive networks into one or more of the grid coupling loops. Inserting a twin-T network, for example, into the grid loops of tubes 7 . . . 8, and 21 . . . 23 will reduce the gain at the null frequency of the twin-T. On the other hand, placing a twin-T in the grid loops of tubes 12 . . . 13 will decrease the gain at all frequencies other than the null frequency of the twin-T but will increase the gain at this frequency. These two effects can be combined to form a sharply tuned amplifier at a frequency $f_0$ with greatly reduced gain at other frequencies $f_1$ and $f_2$. Other adaptations provided with suitable frequency-selective components will readily occur to those skilled in the art.

Referring to FIG. 2, there is illustrated a greatly enlarged cross-sectional view of the micro-modular version of the present apparatus. The circuit is somewhat simplified over that shown in FIG. 1 but is quite similar in circuit arrangement and operation as the embodiment already set out in respect to like portions designated by like reference numerals. It is noted that grid resistors 5, 11, 17, 27, 28 and 29 are connected directly between the respective grids and the cathode of the same discharge device.

Each discharge device, e.g., discharge device 1 is formed of a cylindrical disc type oxide-coated metal cathode 31 having end extensions or terminals 32, a cylindrical or disc type titanium grid electrode 33 having an input terminal 34, and a cylindrical disc type titanium anode 35. It is noted that no terminal extension is particularly necessary for anode 35 inasmuch as it connects and is physically bonded to a cathode 31 of the next discharge device 7. The elements 31, 33 and 35 of discharge device 1 are separated by hollow cylindrical ceramic spacers 36 and 37 which are bonded thereto and which complete the envelope for each discharge device. As more fully set forth in the aforementioned copending application, grid cathode resistor 5 is provided around the inside surface of the ceramic insulator 36 between the cathode and grid. The other discharge devices shown are of identical construction. Resistor 19, the load resistor for the apparatus, is similarly provided around the inside of a cylindrical ceramic insulator 38, which separates discharge devices 12 and 21.

The apparatus set forth in FIG. 2 is quite small having a diameter of 0.32 inch and a height of 47 inch occupying a space of approximately 0.05 in.$^3$. As set forth in the material hereinbefore referred to, the apparatus is closely packed and operates from its own dissipated heat, not requiring filaments for heating the oxide-coated cathodes. The present arrangement is particularly advantageous inasmuch as the anodes of most of the tubes are physically joined to the cathode of the tube immediately thereabove providing increased heating thereof.

It is observed that a minimum of external connections are required in the FIG. 2 arrangement, most of which involve capacitors 9, 15, 24, 25 and 26. The resistors are integral with the stack and obviously no outside connections are required from the anode of one tube to the cathode of the succeeding tube. Also if desired the aforementioned capacitors may be included as cylindrical elements having dimensions similar to the discharge devices. In these capacitors titanium plates are separated by thin synthetic mica sheets. Such capacitors may be included in the same stack or in a stack immediately adjacent the arrangement of FIG. 2. Alternatively, capacitors can be externally wired to apparatus as shown schematically in FIG. 2.

The apparatus of the present invention can also be used to advantage in "integrated circuits" wherein the active elements, which may be several layers of thin films or several regions in a semiconductor, etc., are arranged in a serial relation to each other. The series arrangement of active elements as proposed according to the present invention can greatly reduce the interconnection problem in such integrated circuits. At the same time, the other advantages of the present circuit also apply.

As an amplifying apparatus the apparatus of the present invention has numerous advantages over other amplifying arrangements now in use. As stated, extremely high gains and extremely low output impedances are possible. The amplifier is ideal as a pre-amplifier in audio systems, oscilloscopes, electronic voltmeters, etc. It is also capable of driving low impedance loads such as electronic and audio transducers, low input impedance filters, and the like. It is found to have much higher gain than is attainable with ordinary grounded-cathode, grounded-grid circuits. The present invention produces amplifications on the order of $\mu^{n+1}$ where $n$ is the number of grounded-grid stages .

The apparatus exhibits extremely low noise which has been measured to be less than one-third of the noise in the usual grounded-cathode, grounded-grid circuit. The circuit of the present invention is also highly linear with extremely low harmonic distortion probably because of the high effective load impedance. The circuit is found to be an order of magnitude more linear than ordinary cascaded circuits which produce the same amplification. This makes the apparatus highly desirable for amplifying a plurality of signals without producing inter-modulation thereof, for example, in making A.C. cross-modulation Hall effect measurements.

The apparatus consumes a much lower plate current than would be consumed in a cascaded amplifier and moreover is insensitive to appreciable variations in plate voltage, making power supply requirements unstringent even though the apparatus is used for accurate measurement purposes. The inclusion of but a single relatively small load impedance reduces the power usually lost in such components. The serial arrangement also permits a considerable reduction in actual number of passive components.

The amplifier is in general very attractive for amplifying extremely small signals in a noisy background, perhaps otherwise undetectable with ordinary amplifying apparatus, and the extensive serial arrangement for a very compact apparatus.

While I have shown and described several embodiments of my invention, it will be apparent to those skilled in the art that many changes and modifications may be made without departing from my invention in its broader aspects; and I therefore intend the appended claims to cover all such changes and modifications as fall within the true spirit and scope of my invention.

What I claim as new and desire to secure by Letters Patent of the United States is:

1. A series amplifier comprising: an input terminal; an output terminal; a common connection to which both input and output signals are referred; a positive anode power supply terminal and a negative anode power supply terminal coupled at the operating frequency for said amplifier to said common connection; a plurality of electric discharge devices each having at least an anode, a cathode, and a grid, wherein the space current paths of said discharge devices are in serial relation with each other, the cathode of each of said plurality of discharge devices being coupled to the anode of the next adjacent discharge device, and wherein said plurality of discharge devices are divided into four separate groups including: a first discharge device having its cathode coupled to said negative power supply terminal and its grid coupled at the operating frequency for said amplifier to said input terminal; a plurality of second discharge devices adjacent to said first discharge device, wherein the number of said second discharge devices is determined by the amplification desired for said amplifier, means coupling the cathode of one of said plurality of second discharge devices to the anode of said first discharge device, and means coupling the grid of the last mentioned second discharge device and the grids of the other second discharge devices to the cathode of said first discharge device at the operating frequency for said amplifier; a plurality of third discharge devices adjacent to the group of said second discharge devices, wherein the number of said third discharge devices is determined by the output impedance desired for said amplifier, means coupling the cathode of one of said plurality of third discharge devices to the anode of the second discharge device most remote from said negative power supply terminal, and means coupling the grid of the last mentioned third discharge device and the grids of the other third discharge devices to said output terminal at the operating frequency for said amplifier; and a plurality of fourth discharge devices wherein the number of said fourth discharge devices is determined to be equal the aforementioned numbers of second and third discharge devices plus one; and a load impedance intermediate said plurality of third discharge devices and said plurality of four discharged devices wherein the first terminal of said load impedance is coupled to the anode of the third discharge device most remote from said negative power supply terminal, and wherein the second terminal of said load impedance is coupled to the cathode of a fourth discharge device, said load impedance having a resistive component between said first and second terminals of said load impedance; means coupling the grid of the last mentioned fourth discharge device and the grids of the other fourth discharge devices to the first terminal of the load impedance at the operating frequency for said amplifier; means coupling the anode of the fourth discharge device most remote from said load impedance to said positive power supply terminal; and means coupling the cathode of the last mentioned fourth discharge device to said output terminal.

2. An amplification circuit comprising a cascode amplifier receiving an input and providing an amplified signal at an output terminal thereof, a supply potential terminal, loading means for said cascode amplifier including at least one active amplifying device having an output electrode, a control terminal, and another electrode forming a current carrying path with said output electrode, said current carrying path being coupled in series between the output terminal of said cascode amplifier and said supply potential terminal so that said current carrying path is in load relation to said cascode amplifier, an output terminal for said amplification circuit coupled to an electrode of an active amplifying device of said loading means for providing an output of said amplification circuit, feedback means interposed between said cascode amplifier and said loading means comprising at least one feedback amplifying device having an output electrode, a control terminal, and another electrode forming a current carrying path with said output electrode, wherein said current carrying path is serially interposed between the output terminal of said cascode amplifier and said loading means, said control terminal of said feedback amplifying device being coupled to receive a signal proportional to the output of said amplification circuit, and means coupling the control terminal of the said one active amplifying device of said loading means to an electrode of an amplifying device in said circuit other than one in said loading means.

3. An amplification circuit comprising a first high gain amplifier receiving an input signal and providing an amplified signal including an active amplifying device having an output electrode, a control terminal, and another electrode forming a current carrying path with said output electrode;

a supply potential terminal;

loading means for said first high gain amplifier including at least one active amplifying device having an output electrode, a control terminal, and another electrode forming a current carrying path with said output electrode, wherein said output electrode of said one active amplifying device is coupled to said supply potential terminal and said other electrode is coupled to the output electrode of the active amplifying device of said first high gain amplifier in load relation thereto;

an output connection for said amplification circuit coupled to an electrode of an active amplifying device of said loading means for providing an output of said amplification circuit;

feedback means interposed between said high gain amplifier and said loading means comprising at least one feedback amplifying device having an output electrode, a control terminal, and another electrode forming a current carrying path with said output electrode, wherein said current carrying path is coupled to the active amplifying device of said first amplifying device, said control terminal of the feedback amplifying device being coupled to receive a signal proportional to the output of said amplification circuit; and means coupling the control terminal of said active amplifying device of said loading means to an electrode of an amplifying device in said circuit other than one in said loading means.

4. An amplification circuit comprising a first high gain amplifier receiving an input signal and providing an amplified signal including an active amplifying device having an output electrode, a control terminal, and another electrode forming a current carrying path with said output electrode;

a supply potential terminal;

loading means for said first high gain amplifier including a passive load impedance, and at least one active amplifying device having an output electrode, a control terminal, and another electrode forming a current carrying path with said output electrode, wherein said output electrode of said one active amplifying device is coupled to said supply potential terminal and said passive load impedance is coupled in series between the other electrode of said one active amplifying device and the output electrode of the active amplifying device of said first high gain amplifier in load relation thereto.

an output connection for said amplification circuit coupled to an electrode of an active amplifying device of said loading means, providing an output of said amplification circuit;

feedback means interposed between said high gain amplifier and said loading means comprising at least one feedback amplifying device having an output electrode, a control terminal, and another electrode forming a current carrying path with said output electrode, wherein said current carrying path is coupled in series between the output electrode of the active amplifying device of said first amplifying device and said loading means, said control terminal of the feedback amplifying device being coupled to receive a signal proportional to the output of said amplification circuit, and means coupling the control terminal of said active amplifying device of said loading means to an electrode of an amplifying device in said circuit other than one in said loading means.

5. In an amplification circuit including a plurality of amplifying devices, a cascode amplifier receiving an input and providing an amplified signal at an output terminal thereof.

a supply potential terminal, loading means for said cascode amplifier including at least one active amplifying device having an output electrode, a control terminal, and another electrode forming a current carrying path with said output electrode, said current carrying path being coupled between the output terminal of said cascode amplifier and said supply potential terminal so that said current carrying path is in load relation to said cascode amplifier, an output terminal for said amplification circuit coupled to an electrode of an active amplifying device of said loading means for providing an output of said amplification circuit, feedback means receiving a signal proportional to the output of said amplification circuit and applying the same in a negative sense in said amplification circuit for reducing the output impedance of said amplification circuit, and means coupling the control terminal of said active amplifying device of said loading means to an electrode of an amplifying device in said circuit other than one in said loading means.

6. An amplification circuit comprising a plurality of active amplifying devices each having an output electrode, a control terminal, and at least one other electrode defining a current carrying path with said output electrode;

a high voltage supply terminal, a lower potential point, and an output connection for deriving an amplified output signal from said amplification circuit;

means coupling the current carrying paths of said plural devices in series between said high voltage supply terminal and said lower potential point to provide a series circuit, said devices comprising respectively, in order, starting from said lower potential point in said series circuit and proceeding toward the higher potential high voltage supply terminal:

a first input amplifying device having its control terminal driven from a source of input signal, at least one second device driven through the said series circuit from the first device, having its said other electrode coupled to the output electrode of said first device, and means coupling its control terminal to an electrode of a device of lower potential therefrom in the series circuit, at least one third device having its one other electrode coupled to the output electrode of a said second device, and means coupling its control terminal to receive a signal proportional to the output of said amplification circuit to cause the said third device to provide feedback in said series circuit, and at least one fourth such device having its other electrode coupled to the output electrode of a said third device, with means coupling its control terminal to an electrode of a device of lower potential therefrom in said series circuit towards said point of common reference potential; and means coupling said output connection of said series circuit to an electrode of a device above said second device.

7. An amplification circuit comprising a plurality of active amplifying devices each having an output electrode, a control terminal, and at least one other electrode defining a current carrying path with said output electrode;

a high voltage supply terminal, a lower potential point, and an output connection for deriving an amplified output signal from said amplification circuit;

means coupling the current carrying paths of said plural devices in series between said high voltage supply terminal and said lower potential terminal to provide a series circuit, said devices comprising respectively, in order, starting from said lower potential point in said series circuit and proceeding toward the said high voltage supply terminal:

a first input ampliying device having its control terminal driven from a source of input signal, at least one second device driven through the said series circuit from the first device by having its other electrode coupled to the output electrode of said first device, and means coupling its control terminal to an electrode of a device of lower potential therefrom in said series circuit, at least one third device having its other electrode coupled to the output electrode of a second device, and means coupling its control terminal to receive a signal proportional to the output of said amplification circuit to cause the said third device to provide feedback in said series circuit, and at least a fourth such device for controlling the loading of said prior devices;

a passive load impedance interposed in said series circuit between a third device and said fourth device;

means coupling the control terminal of said fourth device to an electrode of a device of lower potential in said series circuit on the remote side of said impedance from such fourth device; and means coupling the said output connection of said amplication circuit to an electrode of a device on the high voltage supply side of said impedance.

8. The amplification circuit according to claim 7 wherein said amplifying devices comprise hollow cylindrical insulating members and conducting terminals arranged alternately in a stack and a plurality of electric discharge device electrodes supported from adjacent terminals comprising adjacent anodes and cathodes with interposed grid electrodes forming successive serially related discharge devices.

9. An apparatus according to claim 7 wherein the number of such fourth devices is substantially equal in function to the total number of such first, second and third devices.

References Cited by the Examiner

UNITED STATES PATENTS

| | | | |
|---|---|---|---|
| 2,810,025 | 10/57 | Clements | 330—70 |
| 2,920,279 | 1/60 | Speller | 330—70 |
| 2,926,307 | 2/60 | Ehret | 330—18 |
| 2,940,048 | 6/60 | Kenny | 330—70 X |
| 3,024,422 | 3/62 | Jansson | 330—18 |
| 3,105,201 | 9/63 | White et al. | 330—70 X |

FOREIGN PATENTS

| | | |
|---|---|---|
| 497,733 | 11/53 | Canada. |
| 877,019 | 9/61 | Great Britain. |

OTHER REFERENCES

Murray: Article on "An Adjustable Impedance Circuit," Proceedings of the I.R.E., Australia, August 1959, vol. 1, 20, No. 8, pages 487 and 488.

ROY LAKE, *Primary Examiner.*

NATHAN KAUFMAN, *Examiner.*